United States Patent
Fang et al.

[11] Patent Number: 6,114,745
[45] Date of Patent: Sep. 5, 2000

[54] BIPOLAR TRANSISTOR HAVING HIGH EMITTER EFFICIENCY

[75] Inventors: Ming Fang, Plano; Jin Liu, Lewisville; Gilles E. Thomas, Dallas; Viviane Marguerite Do-Bento-Vieira, Coppell, all of Tex.

[73] Assignee: STMicroelectronics, Inc., Carrollton, Tex.

[21] Appl. No.: 09/365,358

[22] Filed: Jul. 30, 1999

[51] Int. Cl.⁷ .................. H01L 31/0312; H01L 23/58; H01L 27/082
[52] U.S. Cl. .................. 257/588; 257/77; 257/587; 257/591
[58] Field of Search ................ 257/77, 587, 588, 257/591

[56] References Cited

U.S. PATENT DOCUMENTS

| | | | |
|---|---|---|---|
| 5,708,281 | 1/1998 | Morishita | 257/198 |
| 5,739,062 | 4/1998 | Yoshida et al. | 438/320 |
| 6,049,098 | 4/2000 | Sato | 257/198 |

*Primary Examiner*—Ngân V. Ngô
*Attorney, Agent, or Firm*—Theodore E. Galanthay; Lisa K. Jorgenson; Peter J. Thoma

[57] ABSTRACT

A vertical conduction NPN bipolar transistor with a tunneling barrier of silicon carbide in the emitter providing a high emitter injection efficiency and high, stable current gain. The emitter structure comprises a heavily doped polysilicon layer atop a silicon carbide layer that contacts a shallow, heavily doped emitter region at the surface of an epitaxial silicon layer, which is disposed on a monocrystallinie silicon substrate. The silicon carbide layer is about 100 to 200 angstroms thick and has a composition selected to provide an energy band gap in the 1.8 to 3.5 eV range. The thickness and composition of the silicon carbide can be varied within the preferred ranges to tune the transistor's electrical characteristics and simplify the fabrication process.

20 Claims, 1 Drawing Sheet

BIPOLAR TRANSISTOR HAVING HIGH EMITTER EFFICIENCY

BACKGROUND OF THE INVENTION

The present invention relates generally to bipolar transistors having a high emitter efficiency, and more particularly to bipolar transistors with a tunneling barrier in the emitter region.

The emitter efficiency of a bipolar transistor is defined by the fraction of the emitter current that crosses into the collector. It is desirable to design a transistor so that the emitter efficiency is as close to the value one as possible in order to get a large current gain. Optimally, the emitter current should come from majority carrier electrons injected from the emitter to the base, and only a negligible fraction should come from minority carrier holes injected in the opposite direction, since such holes will not contribute to collector current.

The back flow of minority carriers can be minimized by appropriately doping the emitter region more heavily than the base region. Alternatively, the back flow of minority carriers can be minimized by use of an insulating or semi-insulating barrier within the emitter region or at the junction between the emitter and base regions. Majority and minority carriers can pass through Such a barrier in accordance with the phenomenon of quantum mechanical tunneling. Improved emitter efficiency can be achieved by selecting a material for the barrier that exhibits a relatively high barrier height for the minority carriers. Such an arrangement can inhibit the back flow of minority carriers through the barrier and thereby improve the injection efficiency, resulting in optimal current gain for the transistor.

U.S. Pat. No. 4,672,413 describes a barrier emitter transistor that employs the tunneling phenomenon. In one embodiment, a tunneling barrier of silicon dioxide is included between the base and emitter regions. In another embodiment, a tunneling barrier of semi-insulating polycrystalline silicon (SIPOS) is formed within the emitter region.

It has become a standard practice to use silicon dioxide as a barrier material for increasing emitter efficiency by inhibiting the back flow of minority carriers in an NPN transistor. However, silicon dioxide has a relatively wide band gap on the order of 9.0 eV. Therefore, conventional devices use only a thin layer of about nine or ten angstroms of silicon dioxide as the barrier material. A greater thickness would reduce tunneling of both majority and minority carriers through the barrier layer, and thus undesirably increase emitter resistance.

In practice, it has been difficult to consistently produce a silicon dioxide barrier layer of about nine or ten angstroms in thickness. Even with precision processing and equipment, undesirable variations in the barrier oxide thickness occur to a degree that the resulting transistors exhibit relatively large fluctuations in gain from device to device. The present invention overcomes this problem.

SUMMARY OF THE INVENTION

It is a principal object of the present invention to provide carrier regulation in a bipolar transistor with an emitter that has a relatively thick tunneling barrier layer. In a preferred embodiment of the invention, silicon carbide or an equivalent material is used as the tunneling barrier material. The use of silicon carbide is generally compatible with conventional process technology.

A bipolar transistor in accordance with the present invention comprises a semiconductor transistor structure having collector, base and emitter regions in which the emitter region includes a tunneling barrier of silicon carbide. Most preferably, the silicon carbide is within the emitter interposed between a heavily doped region of polycrystalline silicon and a heavily doped region of monocrystalline silicon. During processing at elevated temperatures, n type dopant atoms are driven from the polycrystalline silicon through the silicon carbide into the underlying monocrystalline silicon, which produces a shallow PN junction with the underlying p type base region. A bipolar transistor of the NPN type is thus formed, the collector being n type monocrystallinie silicon, the base being p type monocrystalline silicon, and the emitter being formed from adjacent layers of n type monocrystalline silicon, silicon carbide and n type polycrystalline silicon.

The tunneling silicon carbide layer used in the emitter in accordance with the present invention enables fabrication of a bipolar transistor with stabilized characteristics and a high injection efficiency using conventional process technology. The bipolar transistor of the present invention has advantageous application with integrated circuits that use both bipolar and MOS transistors, commonly referred to as BiCMOS semiconductor devices. Other aspects and advantages of the invention will become apparent from a detailed description of a preferred embodiment of the invention as illustrated in the accompanying drawing.

DESCRIPTION OF THE PREFERRED EMBODIMENT

Figure 1:
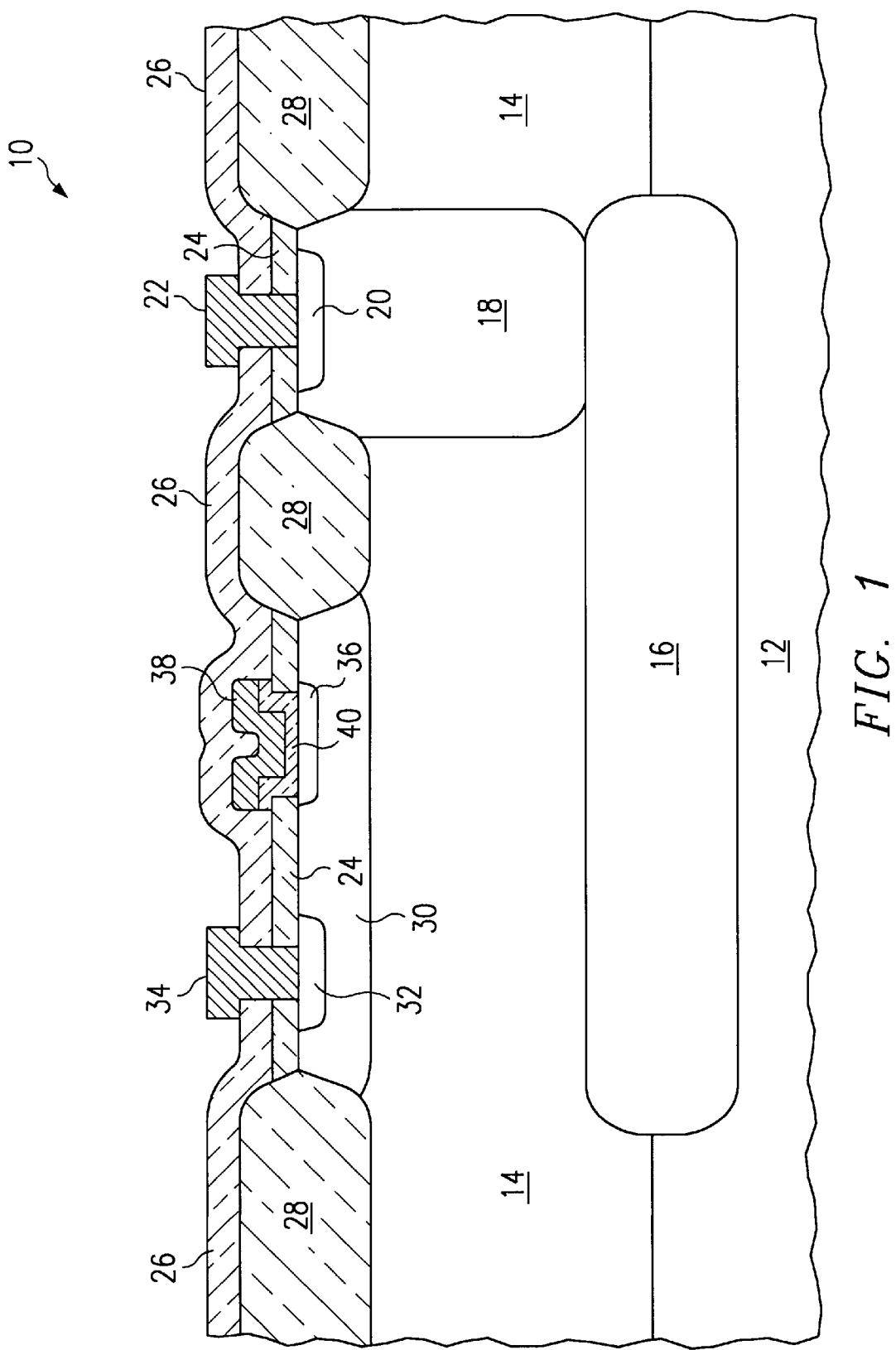
FIG. 1 is a schematic cross-section of a portion of an integrated circuit semiconductor device in which a bipolar transistor of the present invention has been fabricated. Cross-hatching has been left off of the substrate and monocrystalline silicon active regions for clarity of illustration. The relative dimensions are not necessarily to scale.

With reference to FIG. 1, the sole figure herein, a preferred embodiment of the bipolar transistor of the present invention is illustrated and generally designated by reference numeral 10. The transistor 10 is fabricated in a portion of an integrated circuit semiconductor device supported by a p type substrate 12, which is preferably monocrystalline silicon. A conventional n type monocrystalline silicon epitaxial layer 14 is formed atop the substrate 12 and defines the active areas in which regions of the transistor 10 are defined. A conventional heavily doped n type buried collector 16 is formed at the interface of the substrate 12 and epitaxial layer 14. A conventional heavily doped n type sinker 18 extends vertically through the epitaxial layer 14 to provide a low resistance path from the surface to the buried collector 16. A very heavily doped n type contact region 20 is formed at the upper surface of the sinker 18. A conventional metal collector contact 22, which may be fabricated using an aluminum deposition, makes a low resistance contact to the heavily doped region 20.

Conventional insulating layers are used in the fabrication of the transistor 10 shown in FIG. 1. These include a thin TEOS layer 24, a somewhat thicker interlevel dielectric (ILD) layer 26, and a thick field oxide layer 28, which is conventionally silicon dioxide. As is conventional and well known in the art, the ILD layer 26 preferably comprises BPSG.

A narrow portion of the field oxide 28 separates the collector contact region 20 from a p type base region 30. The base region 30 includes a very heavily doped p type contact region 32, which is contacted by metal base contact 34. The emitter of the transistor 10 comprises a composite structure that includes a very heavily doped n type monocrystalline silicon region 36, a very heavily doped polycrystalline silicon layer 38, and a silicon carbide layer 40 therebetween. An emitter contact (not shown) is provided in contact with layer 38 at a location spaced from the site of the cross-section of FIG. 1. The emitter contact is preferably formed of aluminum like contacts 22 and 34 previously described.

The emitter structure may be fabricated by cutting an opening in the thin TEOS layer 24 using plasma etching. Plasma etching or "dry etching" is a well-known technique in the semiconductor industry. A layer of silicon carbide is then deposited using a conventional chemical vapor deposition (CVD) process. A polycrystalline silicon (commonly referred to as "polysilicon") layer is then deposited by a conventional CVD process and then doped to be very heavily n type, preferably using a conventional ion implantation step. Arsenic is the preferred dopant for the implantation step, but phosphorus can also be used. Then, the polysilicon and silicon carbide layers are patterned to form the layers 38 and 40 in the shape generally depicted in FIG. 1 using conventional photolithographic and plasma etching techniques. A subsequent thermal drive-in step causes the arsenic atoms in the polysilicon layer 38 to diffuse through the silicon carbide layer 40 to define the shallow monocrystalline emitter region 36. The drive-in step is preferably performed during the reflow of the BPSG layer 26, which is typically carried out at a relatively high temperature, such as 850° C. to 900° C.

Preferably, the polysilicon emitter region 38 is about 3000 angstroms thick, the silicon carbide layer 40 is from about 100 to 200 angstroms in thickness, and the depth of the monocrystalline silicon emitter region 36 is typically about 100 angstroms. Both emitter portions 38 and 40 are heavily doped n type, and the resulting diffused region 36 also has a high n type concentration.

The silicon carbide barrier layer 40 should be fabricated by depositing silicon carbide having the formula $Si_xC_y$, preferably in a ratio of $Si_{0.7}C_{0.3}$. The deposition can be performed using an appropriate mixture of methane ($CH_4$) and silane ($SiH_4$).

The band gap of the silicon dioxide used as a tunneling barrier in the prior art devices mentioned above is about 9.0 eV. The silicon carbide tunneling barrier of the present invention can be fabricated to have a band gap in the 1.8 to 3.5 eV range. This lower band gap permits a much thicker tunneling barrier layer to be used in the emitter. The thickness of the silicon carbide layer of the present invention is much less critical than the ultrathin silicon dioxide layer of the prior art device. Thus, the present invention achieves process efficiency compared to the process for making the prior art device.

It will also be recognized that both the thickness and composition of the tunneling barrier layer of the present invention can be varied to select the band gap value tunneling the transistor's electrical characteristics. Lowering the band gap of the silicon carbide composition permits use of a thicker tunneling barrier layer. Therefore, a high gain bipolar transistor can be fabricated with consistent characteristics from device to device. Enhanced emitter efficiency is achieved using generally conventional process technology and equipment.

It will be recognized that changes to the preferred embodiment can be made and equivalent elements substituted therein without departing from the spirit and scope of the invention as claimed.

What is claimed is:

1. A bipolar transistor with high emitter efficiency in an integrated circuit semiconductor device, the transistor comprising;

a substrate;

a collector region of a first conductivity type supported by the substrate;

a base region of a second conductivity type supported above the substrate in a PN-junction-forming relationship with the collector region; and an emitter supported above the substrate in a PN-junction-forming relationship with the base region on a face of the base region opposite from the collector region;

wherein the emitter includes a monocrystalline semiconductor region of the first conductivity type at the base-emitter PN-junction, a polycrystalline semiconductor layer of the first conductivity type spaced from the monocrystalline emitter region, and a tunneling barrier layer interposed between and in contact with the monocrystalline region and polycrystalline layer, the tunneling barrier layer having a thickness of about 100 to 200 angstroms and an energy band gap in the range of about 1.8 to 3.5 eV.

2. The bipolar transistor of claim 1 wherein the first conductivity type is n type and the second conductivity type is p type, whereby an NPN bipolar transistor is formed.

3. The bipolar transistor of claim 2 wherein the tunneling barrier layer consists essentially of silicon carbide.

4. The bipolar transistor of claim 3 wherein the silicon carbide has a composition of $Si_xC_y$ wherein x is approximately 0.7 and y is approximately 0.3.

5. The bipolar transistor of claim 1 wherein the substrate is monocrystalline silicon and the transistor regions are defined within an epitaxial silicon layer formed on the substrate.

6. The bipolar transistor of claim 5 wherein the collector region includes a heavily doped buried collector portion, a lightly doped portion between the buried collector portion and the base region, and a heavily doped sinker portion spaced laterally from the base region and extending vertically between the buried collector portion and an upper semiconductor surface portion, whereby a vertical conduction bipolar transistor structure is defined.

7. A bipolar transistor with high emitter efficiency in an integrated circuit semiconductor device, the transistor comprising;

a substrate;

a collector region of a first conductivity type supported by the substrate;

a base region of a second conductivity type supported above the substrate in a PN-junction-forming relationship with the collector region; and an emitter supported above the substrate in a PN-junction-forming relationship with the base region on a face of the base region opposite from the collector region;

wherein the emitter includes a monocrystalline semiconductor region of the first conductivity type at the base-emitter PN-junction, a polycrystalline semiconductor layer of the first conductivity type spaced from the monocrystalline emitter region, and a tunneling barrier layer interposed between and in contact with the monocrystalline region and polycrystalline layer, the tunneling barrier layer consisting essentially of silicon carbide and having a thickness of about 100 to 200 angstroms.

8. The bipolar transistor of claim 7 wherein the first conductivity type is n type and the second conductivity type is p type, whereby an NPN bipolar transistor is formed.

9. The bipolar transistor of claim 8 wherein the silicon carbide has a composition selected to provide an energy band gap in the range of about 1.8 to 3.5 eV.

10. The bipolar transistor of claim 8 wherein the silicon carbide has a composition of $Si_xC_y$ wherein x is approximately 0.7 and y is approximately 0.3.

11. The bipolar transistor of claim 7 wherein the substrate is monocrystalline silicon and the transistor regions are defined within an epitaxial silicon layer formed on the substrate.

12. The bipolar transistor of claim 11 wherein the collector region includes a heavily doped buried collector portion, a lightly doped portion between the buried collector portion and the base region, and a heavily doped sinker portion spaced laterally from the base region and extending vertically between the buried collector portion and an upper semiconductor surface portion, whereby a vertical conduction bipolar transistor structure is defined.

13. A bipolar transistor with high emitter efficiency in an integrated circuit semiconductor device, the transistor comprising;

a substrate;

a collector region of a first conductivity type supported by the substrate;

a base region of a second conductivity type supported above the substrate in a PN-junction-forming relationship with the collector region; and an emitter supported above the substrate in a PN-junction-forming relationship with the base region on a face of the base region opposite from the collector region;

wherein the emitter includes a monocrystalline semiconductor region of the first conductivity type at the base-emitter PN junction, a polycrystalline semiconductor layer of the first conductivity type spaced from the monocrystalline emitter region, and a tunneling barrier layer interposed between and in contact with the monocrystalline region and polycrystalline layer, the tunneling barrier layer consisting essentially of silicon carbide and having a composition selected to provide an energy band gap in the range of about 1.8 to 3.5 eV.

14. The bipolar transistor of claim 13 wherein the first conductivity type is n type and the second conductivity type is p type, whereby an NPN bipolar transistor is formed.

15. The bipolar transistor of claim 14 wherein the silicon carbide has a thickness of about 100 to 200 angstroms.

16. The bipolar transistor of claim 15 wherein the silicon carbide has a composition of $Si_xC_y$ wherein x is approximately 0.7 and y is approximately 0.3.

17. The bipolar transistor of claim 13 wherein the substrate is monocrystalline silicon and the transistor regions are defined within an epitaxial silicon layer formed on the substrate.

18. The bipolar transistor of claim 17 wherein the collector region includes a heavily doped buried collector portion, a lightly doped portion between the buried collector portion and the base region, and a heavily doped sinker portion spaced laterally from the base region and extending vertically between the buried collector portion and an upper semiconductor surface portion, whereby a vertical conduction bipolar transistor structure is defined.

19. The bipolar transistor of claim 17 wherein the polycrystalline semiconductor layer comprises silicon heavily doped with arsenic.

20. The bipolar transistor of claim 17 wherein the substrate comprises p type monocrystalline silicon and the transistor is of the NPN type.

* * * * *